(12) United States Patent
Hung

(10) Patent No.: US 6,635,394 B2
(45) Date of Patent: Oct. 21, 2003

(54) THREE DIMENSIONAL MASK

(75) Inventor: Chi-Yuan Hung, Ilan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 156 days.

(21) Appl. No.: 09/871,073

(22) Filed: May 31, 2001

(65) Prior Publication Data

US 2002/0182515 A1 Dec. 5, 2002

(51) Int. Cl.$^7$ ................................................. G03F 9/00
(52) U.S. Cl. ............................................. 430/5; 430/22
(58) Field of Search ............................. 430/5, 322, 22, 430/30

(56) References Cited

U.S. PATENT DOCUMENTS 6,514,647 B1 * 2/2003 Hinogami et al. ............. 430/5

\* cited by examiner

*Primary Examiner*—S. Rosasco
(74) *Attorney, Agent, or Firm*—Dickinson Wright PLLC

(57) ABSTRACT

A three dimensional mask can adjust the coherence of radiation passing through an edge pattern on the mask by increasing the thickness of an opaque layer to extend the passing path in the edge pattern, thereby reducing the optical proximity effect (OPE) caused by interference. Therefore, shape distortion and depth of focus (DOF) deficiencies occurring on the edge pattern can be prevented to expose a fine pattern to a photoresist layer.

13 Claims, 3 Drawing Sheets

THREE DIMENSIONAL MASK

FIELD OF THE INVENTION

The present invention relates to a semiconductor apparatus, and more particularly to a three dimensional mask which can obtain a good edge pattern to improve the photolithographic exposure process.

BACKGROUND OF THE INVENTION

In the semiconductor industry, photolithographic exposure tools such as steppers and scanners have been used to define patterns in photosensitive material known as photoresist. After photoresist material is spun onto a substrate, an exposure tool repeatedly projects an image of the pattern that is defined on the mask to repeatedly expose the photoresist layer. The properties of the exposed portions of the photoresist layer are altered for subsequent processing steps such as resist development and consecutive substrate etching or implantation.

A mask is typically a transparent plate such as quartz with opaque elements such as a chromium layer on the plate used to define a pattern. A radiation source illuminates the mask according to well-known methods. The radiation transmitted through the mask and exposure tool projection optics forms a diffraction limited latent image of the mask features on the photoresist layer. Further discussion of patterning principles and diffraction limited microlithography can be found on pages 274–276 of VLSI Technology edited by S. M. Sze (©1983).

FIG. 1 is a schematic cross-sectional view of a mask in accordance with the prior art. Referring to FIG. 1, an opaque chromium layer 104 with an opening pattern 106 is formed on a transparent plate 102 by utilizing etching or printing technology to form a mask 100. Generally, the opening pattern 106 on the mask 100 is a periodical dense pattern. While determining the illumination condition, however, numerical aperture (NA) and coherence σ are simultaneously calculated by an infinite period. When the condition is applied to a finite periodical mask pattern, optical proximity effect (OPE) occurs in the edge of the mask pattern, and pattern distortion and depth of focus (DOF) deficiency are produced. FIG. 2 is a diagram illustrating an exposing pattern on a photoresist layer by a conventional mask. As shown in FIG. 2, the center part 202 of the exposing pattern 200 has the same shape as the pattern on the mask 100. However, in the edge part 204 of the exposing pattern 200, pattern distortion occurs. This results with the line width d of edge pattern being unexpectedly enlarged or shrunk. Unfortunately, the circuit on the chip is therefore readily shorted or disconnected, and the process window of the exposure process is decreased.

The causes of the OPE include optical factors of interference between light beams transmitted through adjacent patterns. By regularly deforming the pattern on the mask, an exact exposing pattern can be obtained, and this process is referred to as "optical proximity correction" (OPC). The OPC process must be adjusted in accordance with the illumination condition, and the OPC mask must be modified with a different illumination source to get a perfect pattern. This results in application limits to the OPC mask.

SUMMARY OF THE INVENTION

The present invention provides a three dimensional mask that can improve shape distortion which occurs on the edge pattern and can be applied to different illumination source.

The present invention provides a three dimensional mask adapted for a photolithographic exposure process. The mask comprises a base transparent layer and an opaque layer on the base transparent layer. The opaque layer has an opening pattern that includes an edge opening. A collimating protrusion is located on the opaque layer and surrounds the edge opening. Setting the collimating protrusion improves the interference to get more precise exposure on a photoresist layer.

The present invention also provides a three dimensional mask adapted for a photolithographic exposure process. The mask comprises a base transparent layer and an opaque layer on the base transparent layer. The opaque layer has an opening pattern, and the part of the opaque layer including the opening pattern has a concave surface. The thickness of the opaque layer in the edge of the opening pattern is larger than the thickness of the opaque layer in the center of the opening pattern.

The three dimensional mask of the present invention can improve the shape distortion and depth of focus (DOF) deficiency in the edge pattern caused from the optical proximity effect (OPE) by extending the transmission path of edge pattern to recondition radiation coherence.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a three dimensional mask. By forming the three dimensional mask pattern on the photo-mask, radiation coherence can be reconditioned to prevent the optical proximity effect (OPE) from occurring in the edge pattern, and thereby, shape distortion and depth of focus (DOF) deficiency can be improved. In other words, the radiation coherence, passing through an edge pattern on the mask is reconstructed or adjusted to increase the DOF on the edge pattern. Moreover, the mask can be applied to different illumination sources.

Figure 1:
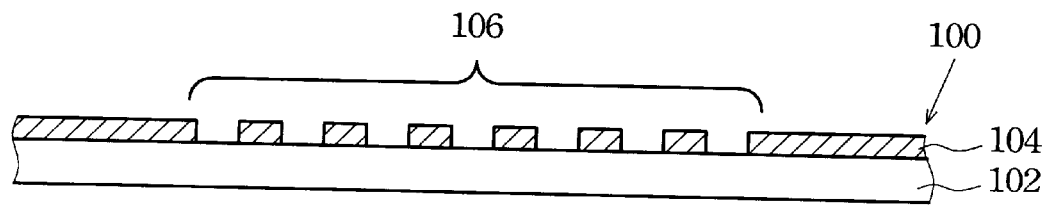
FIG. 1 is a schematic cross-sectional view of a mask in accordance with the prior art.
Figure 2:
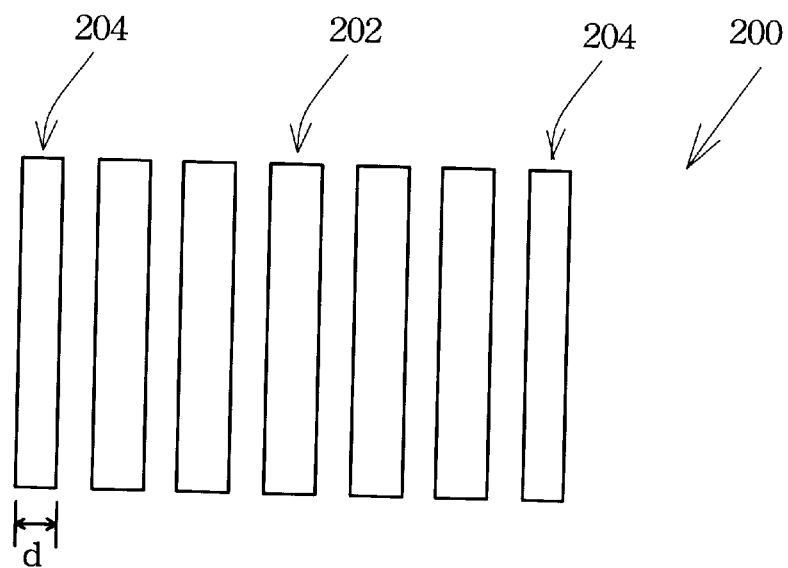
FIG. 2 is a diagram illustrating an exposing pattern on a photoresist layer by a conventional mask of which distortion and depth of focus deficiency occurs in the edge part of the dense pattern.
Figure 3:
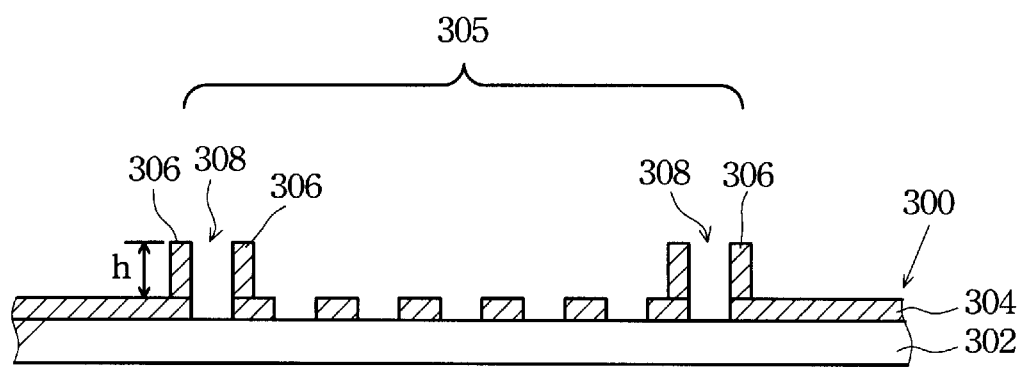
FIG. 3 is a schematic cross-sectional view of a mask in the first preferred embodiment of the present invention.

FIG. 3 is a schematic cross-sectional view of a three dimensional mask in the first embodiment of the present invention. Referring to FIG. 3, the three dimensional mask 300 includes a base transparent layer 302, which can use a material the same as the transparent plate in conventional mask, such as high transparency quartz. On the base transparent layer 302 is an opaque layer 304 having a mask opening pattern 305 that includes electronic circuit design pattern used in a photolitographic exposure process. The material of the opaque layer 304 can be, for example, chromium (Cr), chromium oxide ($CrO_x$), etc., or other opaque materials. In the edge of the opening pattern 305 is an edge opening 308. A collimating protrusion 306 is located on the opaque layer and surrounded the edge openings 308. The collimating protrusion 306 is employed to improve exposing result of edge pattern. The material of the collimating protrusion 306 can be the same as the opaque layer 304, for example, chromium or chromium oxide. The material of the collimating protrusion 306 also can be an opaque material different from the opaque layer 304. The height h of the collimating protrusion 306 is about 2–15 times larger than the thickness of the opaque layer 304, and the height h can be adjusted according to the OPE degree of the pattern.

The three dimensional mask 300 of the present invention can be formed such as by etching process. The opaque layer 304 and collimating protrusion 306 made of chromium and chromium oxide, respectively, are used as an example. A chromium layer and a chromium oxide layer for opaque layer 304 and collimating protrusion 306 are formed in sequence on the base transparent layer 302. A first etching process is performed with a first pattern to fabricate the collimating protrusion 306, and then a second etching process is performed with a second pattern to fabricate the opening pattern 305 in the opaque layer 304. If the opaque layer 304 and collimating protrusion 306 use different materials, precise thickness control will be obtained. If the opaque layer 304 and collimating protrusion 306 use the same materials, the collimating protrusion 306 can be formed with a first pattern by time control etching technology, and then the opening pattern 305 in the opaque layer 304 is formed with a second pattern.

Figure 4:
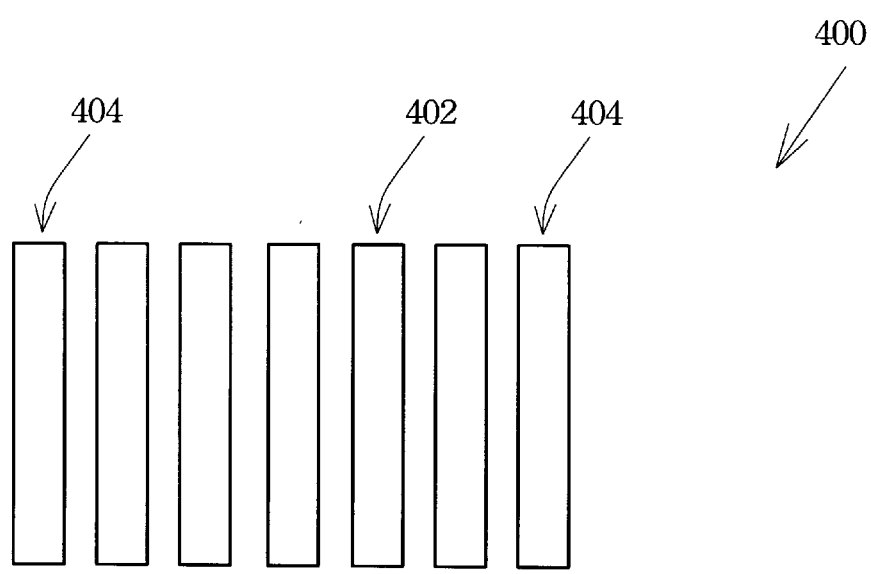
FIG. 4 is a diagram illustrating an exposing pattern on a photoresist layer by the mask in the first preferred embodiment of the present invention.

The three dimensional mask 300 of the present invention can be applied to conventional illumination sources, and preferably applied to an off-axis illumination source, such as an annular source, a quadrapole source, a dipole source, etc. The wavelength of the light radiation can be 365 nm, 248 nm, 193 nm, etc. Since the collimating protrusion 306 extends the transmission path of light radiation in the edge opening 308, the coherence of the radiation in the edge pattern is reconditioned to improve DOF of the edge pattern and to maintain the original pattern shape to prevent pattern distortion. FIG. 4 is a diagram illustrating an exposing pattern on a photoresist layer by the mask of the first embodiment of the present invention. Referring to FIG. 4, the center pattern 402 is kept in original mask pattern. The edge pattern 404 can be a semi-iso line that is adjacent to a dense pattern region in one side and adjacent to a non-pattern region in the other side. The edge pattern 404 can be maintained in the original pattern on the mask 300 and get a good DOF because the coherence of the radiation passing through the edge pattern 404 is reconditioned and the aerial image is improved. Therefore, utilizing the three dimensional mask of the present invention can enlarge the process window of the exposure process.

Figure 5:
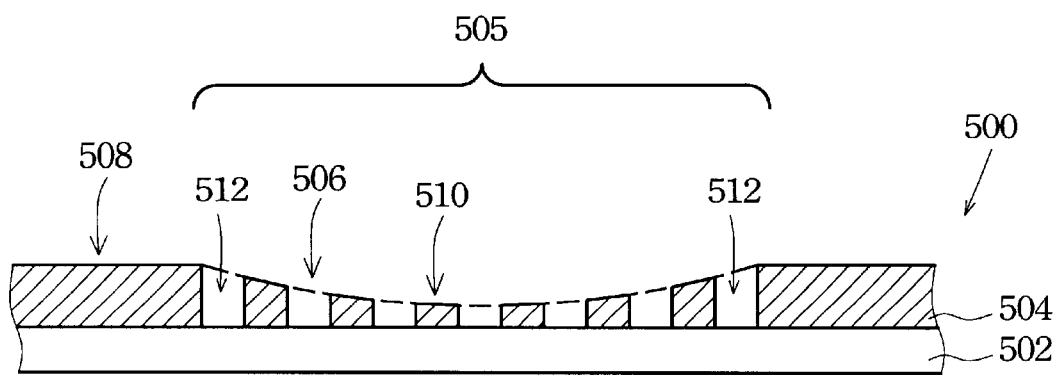
FIG. 5 is a schematic cross-sectional view of a mask in the second preferred embodiment of the present invention.

The present invention also provides another three dimensional mask in the second embodiment. FIG. 5 is a schematic cross-sectional view of the three dimensional mask of the second embodiment of the present invention. Referring to FIG. 5, the three dimensional mask 500 includes a base transparent layer 502, and the base transparent layer 502 can be made of material such as high transparency quartz. On the base transparent layer 502 is an opaque layer having a mask opening pattern 505 that is a common mask pattern in the photolithographic exposure process. The material of the opaque layer 504 can be chromium (Cr), chromium oxide ($CrO_x$), or other opaque materials. The opaque layer 504 where the opening pattern 505 is included has a concave surface 506 which is lower in the center and higher in the edge. Hence, the thickness of the opaque layer 504 in the edge part 508 of the opening pattern 505 is larger than the thickness of the opaque layer 504 in the center part 510 of the opening pattern 505. The thickness of the opaque layer 504 in the edge part 508 is generally 2 to 15 times larger than the thickness of the opaque layer 504 in the center part 510. The profile of the concave surface 506 is designed according to the opening pattern 505.

The three dimensional mask 500 can be applied to a conventional illumination source, such as an annular source, a quadrapole source, a dipole source, etc. The wavelength of the light radiation can be 365 nm, 248 nm, or 193 nm, etc. According to the opening pattern 505 on the mask 500, the surface profile distribution is thereby calculated. The coherence of radiation transmitted through each opening of opening pattern 505 can be reconditioned to fit the requirement for interfering a desired pattern. In the opening pattern 505, the opaque layer 504 beside the edge opening 512 is thicker, and therefore, the light transmission path channel in the edge opening 512 is longer and extended. The extended transmission path can recondition the coherence of radiation passing through the edge opening 512 to obtain preferred aerial image.

According to the above description, the three dimensional mask of the present invention can improve pattern distortion and DOF deficiency problems caused from OPE in the edge pattern by reconditioning the coherence of radiation transmission through the mask of the present invention.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A three dimensional mask adapted for a photolithographic exposure process, comprising:

a base transparent layer;

an opaque layer on the base transparent layer having an opening pattern, wherein the opening pattern includes an edge opening to serve as a light transmission path therein; and a collimating protrusion located on the opaque layer and surrounded by the edge opening for extending the light transmission path within the edge opening to adjust the radiation coherence of the light transmission path in the opening pattern by the collimating protrusion.

2. The mask according to claim 1, wherein a material of the base transparent layer comprises quartz.

3. The mask according to claim 1, wherein a material of the opaque layer comprises chromium.

4. The mask according to claim 1, wherein a material of the opaque layer comprises chromium oxide.

5. The mask according to claim 1, wherein a material of the collimating protrusion comprises chromium.

6. The mask according to claim 1, wherein a material of the collimating protrusion comprises chromium oxide.

7. The mask according to claim 1, wherein the height of the collimating protrusion is about 2–15 times larger than the thickness of the opaque layer.

8. A three dimensional mask adapted for a photolithographic exposure process, comprising:

a base transparent layer; and an opaque layer on the base transparent layer having an opening pattern, wherein a portion of the opaque layer including the opening pattern has a concave surface and the thickness of the opaque layer in the edge of the opening pattern is larger than the thickness of the opaque layer in the center of the opening pattern for adjusting the radiation coherence in the opening pattern by a thickness difference between the edge and the center of the concave surface of the opaque layer.

9. The mask according to claim 8, wherein a material of the base transparent layer comprises quartz.

10. The mask according to claim 8, wherein a material of the opaque layer comprises chromium.

11. The mask according to claim 8, wherein a material of the opaque layer comprises chromium oxide.

12. The mask according to claim 8, wherein profile of the concave surface is designed according to the opening pattern.

13. The mask according to claim 8, wherein the thickness of the opaque layer in the edge of the opening pattern is 2–15 times larger than the thickness of the opaque layer in the center of the opening pattern.

* * * * *